United States Patent [19]

De Concini et al.

[11] Patent Number: 4,851,611
[45] Date of Patent: Jul. 25, 1989

[54] DEVICE FOR THE EXTERNAL CONNECTION OF ELECTRICAL CABLES OF A CONTAINER BODY

[75] Inventors: Roberto De Concini, Zola Predosa; Gianni Fargnoli, Anzola Emilia, both of Italy

[73] Assignee: Weber S.r.l., Turin, Italy

[21] Appl. No.: 41,151

[22] Filed: Apr. 22, 1987

[30] Foreign Application Priority Data

Apr. 22, 1986 [IT] Italy .............................. 53316/86[U]

[51] Int. Cl.⁴ .............................................. H05K 5/00
[52] U.S. Cl. .................................. 174/52.3; 174/65 G
[58] Field of Search ................ 174/52 S, 65 R, 65 G, 174/DIG. 2, 81, 96, 98, 99 R, 152 G, 153 G, 155, 156, 157; 248/56, 68.1

[56] References Cited

U.S. PATENT DOCUMENTS

| | | | |
|---|---|---|---|
| 2,686,216 | 8/1954 | Appleton et al. | 174/81 |
| 3,328,513 | 6/1967 | Goldsobel | 174/81 |
| 3,484,535 | 12/1969 | Luchetta | 174/DIG. 2 |
| 3,742,119 | 6/1973 | Newman | 248/68.1 X |

FOREIGN PATENT DOCUMENTS

| | | | |
|---|---|---|---|
| 235554 | 10/1959 | Australia | 174/65 R |
| 2633187 | 1/1978 | Fed. Rep. of Germany | 174/65 G |
| 2040107 | 8/1980 | United Kingdom | 174/65 R |

Primary Examiner—A. T. Grimley
Assistant Examiner—David A. Tone
Attorney, Agent, or Firm—Gifford, Groh, Sheridan, Sprinkle and Dolgorukov

[57] ABSTRACT

A device for the external connection of electrical cables electrically connected to component elements disposed within a container body comprising ordered housing means through which pass these cables which extend out of the container body.

9 Claims, 3 Drawing Sheets 4,851,611

DEVICE FOR THE EXTERNAL CONNECTION OF ELECTRICAL CABLES OF A CONTAINER BODY

BACKGROUND OF THE INVENTION

The present invention relates to a device for the external connection of electrical cables electrically connected to component elements disposed within a container body, in particular, but not exclusively, the present device relates to the external connection of component elements of a central electronic processing unit of an injection and/or ignition system for a heat engine.

As is known, for the external connection of electrical cables which are electrically connected to component elements within a container body a connector is used which is disposed in an aperture of the container body itself and to this connector is coupled the complementary terminal connector of the electrical cables of various external circuits.

SUMMARY OF THE INVENTION

The object of the present invention is that of providing a device for the external connection of electrical cables which are electrically connected to component elements within a container body, which will be of more economical construction yet offer the maximum guarantees of reliability and convenience of use and assembly.

According to the present invention there is provided a device for the external connection of electrical cables electrically connected to component elements disposed within a container body, characterized by the fact that it comprises ordered housing means through which pass said cables which extend out from said container body.

BRIEF DESCRIPTION OF THE DRAWINGS

For a better understanding of the present invention a particular embodiment is now described, by way of non-limitative example, with reference to the attached drawings, in which.

DETAILED DESCRIPTION OF THE INVENTION

Figure 1:
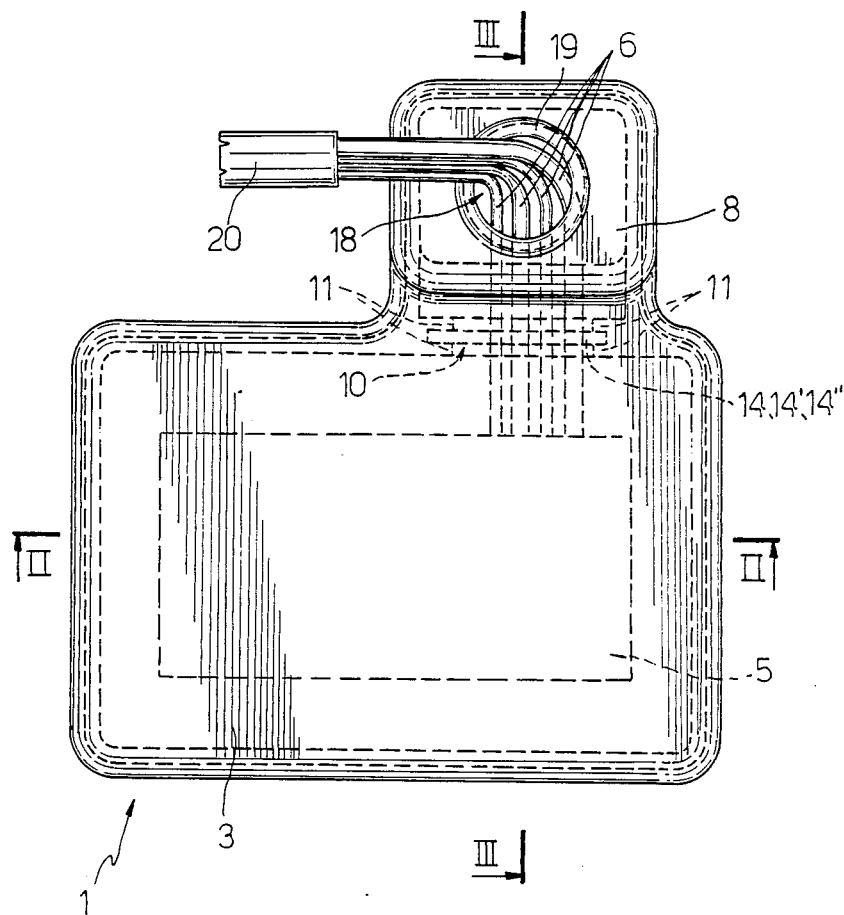
FIG. 1 is an underplan view of a container body with the device for external connection of electrical cables according to the present invention.
Figure 3:
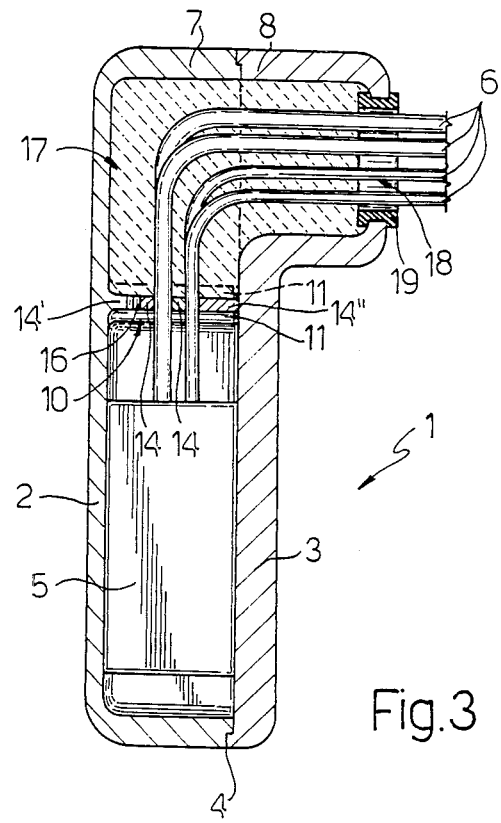
FIGS. 2 and 3 are sectioned views taken on the lines II—II and III—III respectively of the container of FIG. 1.
Figure 2:
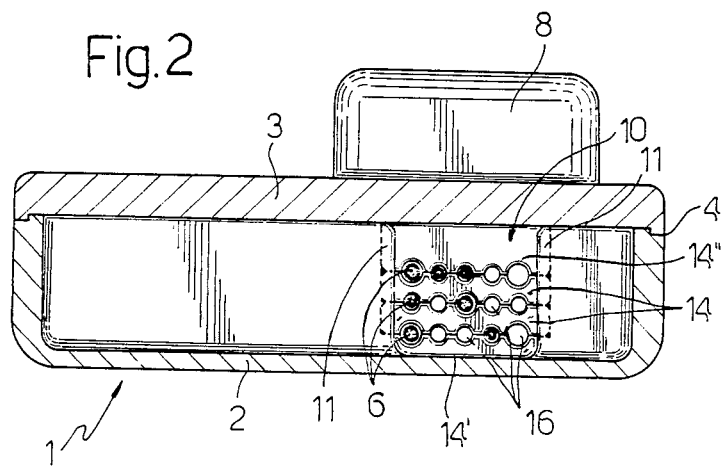
Figure 4:
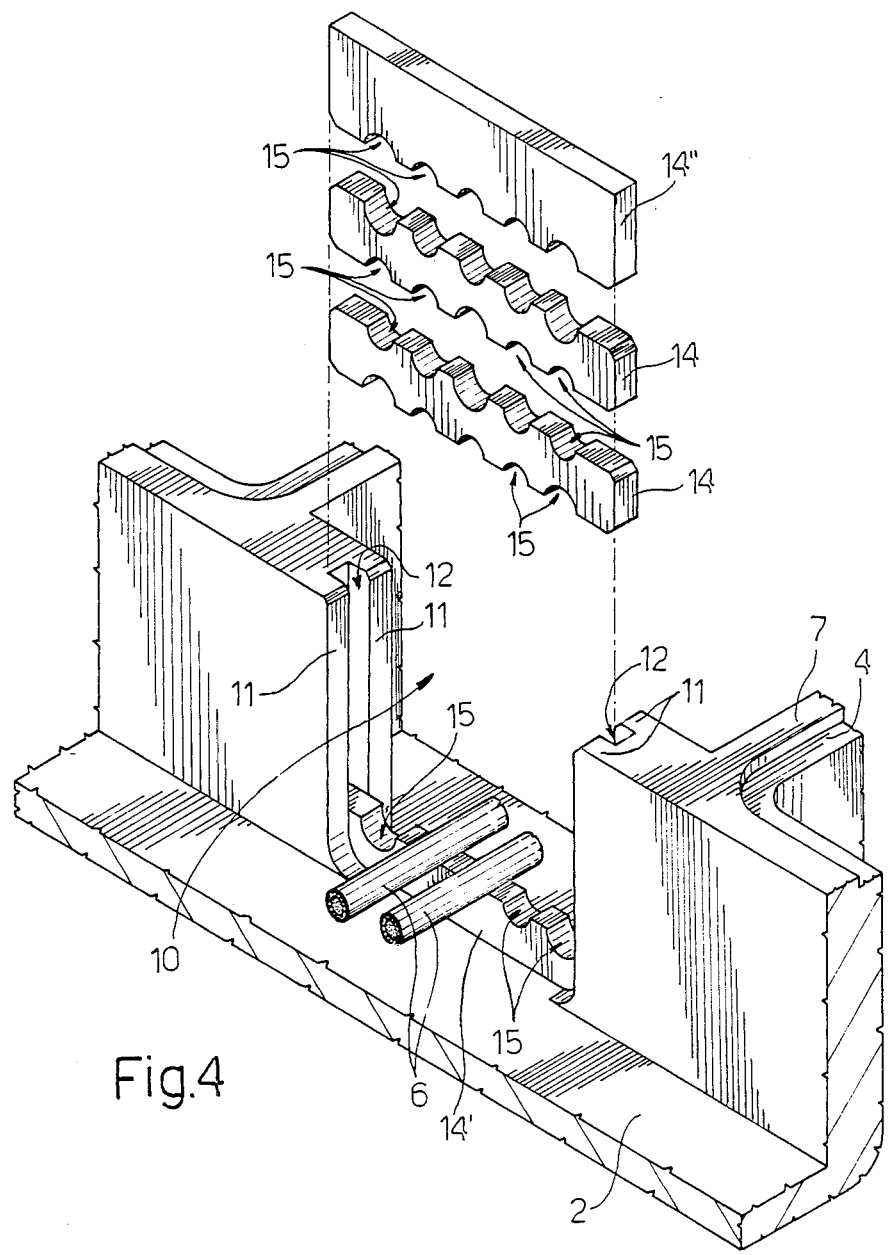
FIG. 4 is a cut away exploded perspective view of a portion of the container of FIG. 1.

With reference to FIGS. 1 through 3, the reference numeral 1 indicates a container body constituted by two half-shells 2, 3 respectively, of substantially rectangular form and the first constituting a bowl and the second a cover. These half-shells 2 and 3 are joined along a perimetral junction line 4 in an hermetic and permanent manner or with separable means, and within this body 1 are housed component elements 5 to which are connected electrical cables 6 which pass out from the container body 1 in a manner which will be described according to the present invention, for connection to external circuit elements. In particular, these half-shells 2 and 3 have respective superimposed laterally projecting portions 7 and 8, and in correspondence with the portion 7 the side wall of the half-shell 2 has an aperture 10 delimited by two pairs of tongues 11 which form respective inner grooves 12 aligned with the side wall of the half-shell 2. In these grooves 12 are inserted and housed, one above the other, the ends of combs 14 which are therefore aligned in the plane of these grooves 12 and have along their upper and lower edges semi-circular cavities 15, such as to define, in combination, through holes 16 which constitute ordered passages for the electrical cables 6. In particular, the comb nearest the half-shell 2, indicated 14', is integral with the half-shell 2 itself, whilst the outermost comb at the opposite end, indicated 14", is locked by the inner surface of the half-shell 3 or else can be integral with the half-shell 3 itself. The combs 14' and 14" naturally have semi-circular cavities 15 formed only on the side facing the adjacent combs 14.

The assembly of said device for the connection of electrical cables 6, according to the present invention, takes place with the ordered arrangement of these cables 6, already connected to the component elements 5 positioned on the half-shell 2, progressively into the various semi-circular cavities 15 of the combs 14' and successive combs 14 and 14" which are fitted with their ends into the grooves 12 until the various through holes 16 have been formed with the various electrical cables 6 positioned in and passing through them; the last comb 14' (in the case in which it is not integral with the half-shell 3) is locked by the secure closure of the half-shell 3 onto the half-shell 2. Outwardly of the combs 14 the electrical cables 6 pass through an internal chamber 17 defined by the portions 7 and 8 of the half-shells 2 and 3, and then pass out through a hole 18 formed on one face of the portion 8. The set of cables 6 in the chamber 17 can conveniently be embedded in resin for sealing, which need not completely fill the chamber 17 itself, and around the hole 18 can be disposed a rubber ring 19 for better re-grouping of the bundle of these cables 6 which, externally of the container body 1, can be clad in a common sheath 20 (FIG. 1).

The advantages obtained with the device of the present invention are evident from what has been described in that the ordered arrangement of electrical cables 6 passing out from the container body 1, obtained through the passage through various through holes 16 of the combs 14, allows the need for an interconnection connector between the external circuit elements and the component elements disposed within the container body 1 to be eliminated.

Finally, it is clear that the embodiment of the present invention described and illustrated can have modifications and variations introduced thereto without departing from the scope of the invention itself. Among other things the component elements 5 housed within the container body 1 can be of various different type, and for example can belong to an electronic central control unit of an injection and/or ignition system for a heat engine.

We claim:

1. A device having a plurality of electrical component elements permitting electrical connection to said elements to be made externally of said device, comprising:
    at least two container parts;
    a plurality of electrical component elements contained between said at least two container parts;
    electrical cables electrically connected to said component elements and passing out of said container so as to permit electrical connection to said component elements to be made externally of said container parts;
at least two combs forming between them apertures for ordering said cables; and
a pair of container portions located one each on each of said container parts and integrally formed therewith, said integrally formed container portions trapping said combs between them;
wherein said device additionally comprises an external chamber formed by said container parts on the side of said combs opposite said electrical component elements.

2. The invention according to claim 1, wherein at least one of said combs is displaceable with respect to the other of said combs so as to allow insertion of said cables therebetween.

3. The invention according to claim 1, wherein said apertures are formed by semicircular cavities on adjacent and facing surfaces of said combs.

4. The invention according to claim 1, wherein said combs include comb ends, and said integrally formed container portions comprise aligned guides dimensioned to receive said comb ends therein.

5. The invention according to claim 1, wherein said device additionally comprises an insulating material contained in said external chamber and embedding said cables therein, thereby forming said cables and said container parts into a single unit.

6. The invention according to claim 1, wherein at least one of said combs is integrally formed with one of said container parts.

7. The invention according to claim 1, wherein said electrical component elements comprise part of a central electronic process unit of at least one of an injection or an ignition system for a heat engine.

8. The invention according to claim 1, wherein said two container parts comprise housing halves.

9. The invention according to claim 1, wherein said combs number at least three.

* * * * *